United States Patent [19]
Chang et al.

[11] Patent Number: 5,821,146
[45] Date of Patent: Oct. 13, 1998

[54] METHOD OF FABRICATING FET OR CMOS TRANSISTORS USING MEV IMPLANTATION

[75] Inventors: Kuang-Yeh Chang, Los Gatos; Yowjuang W. Liu, San Jose, both of Calif.; Mark I. Gardner, Cedar Creek; Fred Hause, Austin, both of Tex.

[73] Assignee: Advanced Micro Devices, Inc., Sunnyvale, Calif.

[21] Appl. No.: 479,880

[22] Filed: Jun. 7, 1995

[51] Int. Cl.$^6$ .................................................. H01L 21/336
[52] U.S. Cl. .......................... 438/299; 438/301; 438/303; 438/306; 438/307; 438/199
[58] Field of Search ........................ 437/44, 29, 41 RLD, 437/40 RLD, DIG. 931; 438/299, 301, 303, 306, 307, 199

[56] References Cited

U.S. PATENT DOCUMENTS

| | | |
|---|---|---|
| 4,764,477 | 8/1988 | Chang et al. . |
| 5,200,351 | 4/1993 | Hadjizadeh-Amini . |
| 5,489,540 | 2/1996 | Liu et al. .................................. 437/34 |
| 5,491,099 | 2/1996 | Hsu .......................................... 437/35 |
| 5,504,023 | 4/1996 | Hong ........................................ 437/44 |
| 5,512,506 | 4/1996 | Chang et al. ............................. 437/44 |
| 5,595,919 | 1/1997 | Pan .......................................... 437/29 |

*Primary Examiner*—Charles L. Bowers, Jr.
*Assistant Examiner*—Lynne A. Gurley
*Attorney, Agent, or Firm*—H. Donald Nelson

[57] ABSTRACT

A method of manufacturing a transistor having LDD regions in which the source and drain regions are formed by implanting ions through a photoresist layer at an energy of 1 MeV and greater and the LDD regions are formed by low energy ion implantation after the oxide layer is removed from the active region and the gate. In a second embodiment, the source and drain regions are formed without a photoresist layer by ion implantation and the LDD regions are formed by low energy ion implantation after the oxide layer is removed from the active region and the gate.

10 Claims, 6 Drawing Sheets

5,821,146

METHOD OF FABRICATING FET OR CMOS TRANSISTORS USING MEV IMPLANTATION

FIELD OF THE INVENTION

The present invention generally relates to the fabrication of field effect transistors (FETs) and Complementary Metal Oxide Silicon (CMOS) transistors; more particularly, this invention describes a simplified process of forming FETs and CMOS transistors having lightly doped drain (LDD) regions by using ion implant.

BACKGROUND OF THE INVENTION

Lightly doped drain (LDD) regions have commonly been used to reduce the hot electron effect in a field effect transistor (FET). This is made possible by providing LDD regions which separate the source and drain regions from the channel region, thereby reducing the electric field at the drain pinch-off region and thus increasing the channel gated diode breakdown voltage and reducing electron impact ionization (hot electron effects).

An FET having LDD regions is typically fabricated in an active region of a substrate. For example, the active region has a $P^-$-type background doping and is bounded by field oxide (FOX) regions which electrically isolate the FET from other devices formed in the same substrate. To form an N-channel FET, the conventional processing techniques implant regions located at both ends of a gate with a light dose of an N-type dopant using the gate as a mask. Two $N^-$ regions formed by the implant define a channel underlying the gate. A spacer material layer is formed over the entire structure and etched so that spacers remain at the ends of the gate. These spacers overlie portions of the $N^-$ regions adjacent to the gate structures. Thereafter, a second implant is performed with a heavier dose of an N-type dopant to form $N^+$ source and drain regions in the $N^-$ regions. During the second implant, the spacers mask the underlying $N^-$ regions. The $N^-$ regions which do not receive the second implant become the LDD regions. Thus, the width of the spacers defines the width of the LDD regions.

The conventional manner of forming spacers is to perform a blanket etch of a spacer material layer, typically an oxide layer, which is provided over the entire area of the substrate. However, because of non-uniformities of the etching rate over the entire wafer area, there may be a removal of materials from the substrate, referred to as silicon loss in active regions and oxide loss in field oxide regions which undesirably impacts the performance and reliability of the FET.

One method of reducing silicon loss in active regions and oxide loss in field oxide regions is to use an etch stop layer, for example, a silicon nitride ($Si_3N_4$) layer, overlying the substrate, the gate, and the field oxide regions of a partially fabricated FET prior to forming the spacer material layer. The spacer material is formed of a material which can be selectively etched with respect to the etch stop layer. An etchant is selected which selectively etches the spacer material layer so that the nitride layer will not be penetrated by the etchant either during the etching of the spacer material layer to form the LDD spacers or during the etching to remove the LDD spacers. Such a method is described in U.S. Pat. No. 5,200,351 issued Apr. 6, 1993, to Zahra Hadjizadeh-Amini, and assigned to the Assignee of the subject Application.

While the above method is able to reduce silicon loss in active regions and oxide loss in field oxide regions, it involves two masking steps to form the source, drain and LDD regions in a typical FET LDD fabrication process. For a N-channel FET, the two masking steps are: an $N^-$ mask to form the $N^-$ regions, and an $N^+$ mask to form $N^+$ source and drain regions (or for a P-channel FET, a $P^-$ mask to form the $P^-$ regions and a $P^+$ mask to form the $P^+$ source and drain regions). In the case of a typical CMOS LDD fabrication process, four masking steps are required to form the source, drain and LDD regions. The four masking steps are: a $N^-$ mask to form the $N^-$ regions, a $P^-$ mask to form the $P^-$ regions, a $N^+$ mask to form $N^+$ source and drain regions and a $P^+$ mask to form the $P^+$ source and drain regions. Each masking step typically includes the sequential steps of preparing the substrate, applying the photoresist material, soft-baking, aligning and selectively exposing the photoresist to radiation by using a mask, baking, developing the patterns in the resist, hard baking, implanting a desired dose of a dopant with the required conductivity type, stripping the photoresist, and then cleaning of the substrate. These processing steps associated with each masking step adversely increase cycle time and process complexity and also introduce particles and defects, resulting in an increase in cost and yield loss. Hence, there is a need to provide a method for forming FET and CMOS transistors with LDD regions which reduces silicon loss in active regions and oxide loss in field oxide regions, while at the same time lessens the number of masking steps required. The present invention addresses such a need.

SUMMARY OF THE INVENTION

One aspect of the invention is to provide a method of fabricating an FET in which silicon loss in active regions and oxide loss in field oxide regions are reduced and process complexity is minimized by reducing the number of masking steps.

Another aspect of the invention is to provide a method of fabricating an FET having LDD regions in which silicon loss in active regions and oxide loss in field oxide regions are reduced and process complexity is minimized by reducing the number of masking steps.

Still another aspect of the invention is to provide a method of fabricating CMOS transistors in which silicon loss in active regions and oxide loss in field oxide regions are reduced and process complexity is minimized by reducing the number of masking steps.

Yet another aspect of the invention is to provide a method of fabricating CMOS transistors having LDD regions in which silicon loss in active regions and oxide loss in field oxide regions are reduced and process complexity is minimized by reducing the number of masking steps.

These and other aspects and advantages of the present invention are accomplished by providing an etch stop layer, for example, a silicon nitride ($Si_3N_4$) layer, overlying a substrate, a gate which includes side edges, an active region with a first conductivity type and field oxide regions of a partially fabricated FET prior to forming the spacer material layer. The spacer material is formed over the gate and the active region. The spacer material layer comprises a material which can be selectively etched with respect to the etch stop layer. If the etch stop layer is formed of nitride, the spacer material layer may be formed of an oxide of silicon, for example, $SiO_2$. An etchant is selected which selectively etches the spacer material layer so that the nitride layer will not be penetrated by the etchant either during the etching of the spacer material layer. Next, a disposable material layer, such as a photoresist material, with a selected thickness is formed over the spacer material layer including the gate and the active region. Thereafter, heavily doped source and drain regions are formed in the active region by providing a first dopant of a second conductivity type through the disposable material layer and using the spacer material around the side edges of the gate a mask. The first dopant may be provided, for example, by using ion implantation. The ion implant may use an energy level of, for example, greater than 1 million electron volts (MeV). Next, the etchant is used to selectively remove the spacer material layer without causing any silicon loss in active regions and oxide loss in field oxide regions. The areas of the active region around the side edges of the gate which was originally covered by the spacer material and the heavily doped source and drain regions are then lightly doped by providing a second dopant of the second conductivity type. The second dopant may be provided, for example, by using ion implantation. The ion implant may use an energy level of, for example, greater than 20 thousand eV (KeV). The areas of the active region around the side edges of the gate form the LDD regions. Therefore, with the present invention, an FET may be formed without requiring any mask as compared to the conventional method which requires two masks (a $N^+$ and a $N^-$ masks, or a $P^+$ and a $P^-$ masks) to form the source, drain and the LDD regions. Furthermore, with the present invention, a CMOS transistor requires only one mask (a $N^+$ or a $P^+$ mask), instead of four masks (a $N^+$, a $N^-$, a $P^+$ and a $P^-$ mask) to form the source, drain and the LDD regions.

A method, in accordance with the present invention, of fabricating an FET having a lightly doped drain region without using any mask, comprising the sequential steps of (a) providing a substrate having an active region with a first conductivity type defined by field oxide regions; (b) providing a gate, having side edges, overlying a portion of said active region; (c) forming an oxide layer over said active region, including said gate; (d) forming a disposable material layer of a first thickness over selected areas of the substrate including said first active region; (e) providing a first dopant of a second conductivity type to form heavily doped source and drain regions of said second conductivity type about the side edges of said gate through said disposable material layer; (f) removing said disposable material layer over said active region; (g) removing said oxide layer over said active region; and (h) providing a second dopant of said second conductivity type to form a lightly doped drain region of said second conductivity type about one of the side edges of said gate adjacent to said heavily doped drain region.

The present invention is also concerned with providing a method of fabricating a CMOS transistor having first and second lightly doped drain regions using only one mask. The method comprises the sequential steps of (a) providing a substrate having a first active region with a first conductivity type and a second active region with a second conductivity type defined by field oxide regions; (b) providing a first gate having side edges overlying a portion of said first active region, and a second gate having side edges overlying a portion of said second active region; (c) forming an oxide layer over said first and second active regions, including said first and second gates; (d) forming a disposable material layer of a thickness over selected areas of the substrate including said first active region and excluding said second active region; (e) providing a first dopant of said second conductivity type to form first heavily doped source and drain regions of said second conductivity type about the side edges of said first gate through said disposable material layer and to form a displaced implant region of the second conductivity type which is displaced beneath said second gate at a distance; and (f) implanting a second dopant of said first conductivity type to form second heavily doped source and drain regions of said first conductivity type about the side edges of said second gate while said first active region is protected by said disposable material layer.

By using the method of the present invention, FET or CMOS transistors having LDD regions can be fabricated with a lesser number of masking steps. Consequently, manufacturing cost, cycle times and yield loss can be minimized.

Still other aspects and advantages of the present invention will become readily apparent to those skilled in the art from the following detailed description, wherein only the preferred embodiments of the invention have been shown and described, simply by way illustration of the best mode contemplated by the inventors of carrying out the invention. As will be realized, the invention is capable of other and different embodiments, and its several details are capable of modifications in various respects, all without departing from the invention. Accordingly, the drawings and descriptions are to be regarded as illustrative in nature, and not as restrictive.

It will be appreciated that these drawings are for the purposes of illustration, and are therefore not necessarily drawn to scale.

DETAILED DESCRIPTION OF THE PREFERRED EMBODIMENTS

The method of the present invention will be described with reference to the formation of CMOS transistors having LDD regions. However, the method is applicable to other processes, for example, a process for forming N-channel MOS transistors, P-channel MOS transistors, or Bipolar—CMOS transistors (commonly known as BiCMOS transistors). Furthermore, the following detailed description is of the best modes presently contemplated by the inventors for practicing the invention. It should be understood that the descriptions of these preferred embodiments are merely illustrative and that they should not be taken in a limiting sense.

Figure 1A:
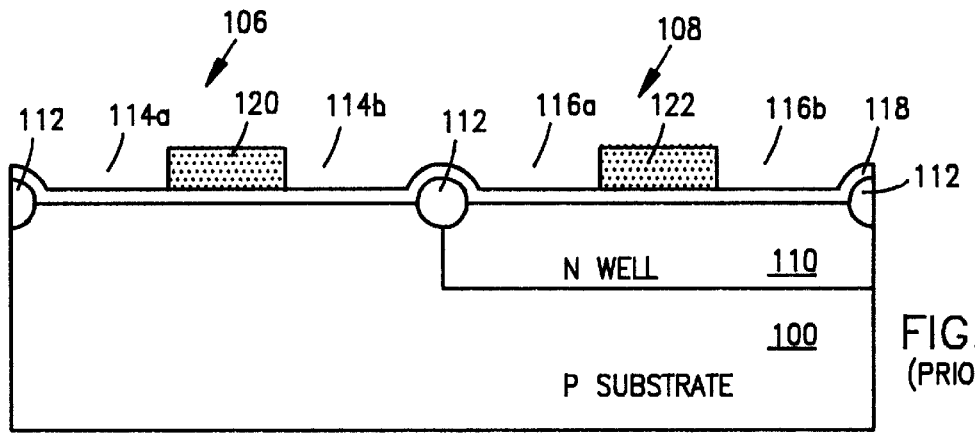
FIGS. 1A–I are schematic, cross-sectional illustrations showing the various stages of a conventional LDD process for fabricating CMOS transistors which uses four masks.

FIGS. 1A through 1I illustrate a LDD process for fabricating CMOS transistors which uses four masks, such as the process disclosed in U.S. Pat. No. 5,200,351 issued Apr. 6, 1993, to Zahra Hadjizadeh-Amini, and assigned to the Assignee of the subject Application. FIG. 1A shows a P substrate (a wafer) 100 with an N-well region 110, and a N-channel transistor 106 and a P-channel transistor 108 formed thereon. The transistors 106 and 108 shown here are prior to source, drain and LDD ion implantation. Using conventional fabrication techniques, field oxide regions 112 are formed on the substrate 100 to define active regions 114a, 114b, 116a and 116b. A gate oxide layer 118 is provided on the active regions 114a, 114b, 116a and 116b and also over the field oxide regions 112. Thereafter, gate structures 120 and 122 are formed on the active regions 114a, 114b, 116a and 116b. Active regions 114a, 114b and gate 120 will respectively form the drain, source and gate regions of the N-channel transistor 106. Similarly, active regions 116a, 116b and gate 122 will respectively form the source, drain and gate regions of the P-channel transistor 108.

Figure 1B:
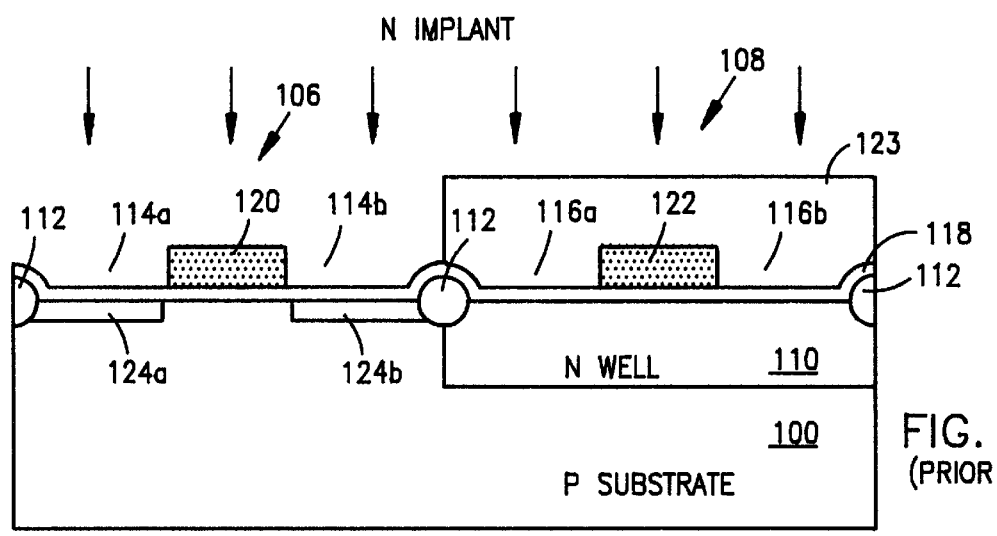

In a first masking step and a first ion implant step, shown in FIG. 1B, a layer of photoresist material 123 is selectively formed over the substrate 100 which effectively masks gate structure 122, and active regions 116a and 116b. Then, a N⁻ implant is used to form N-channel transistor lightly doped regions 124a and 124b which are self-aligned with the gate 120.

Figure 1C:
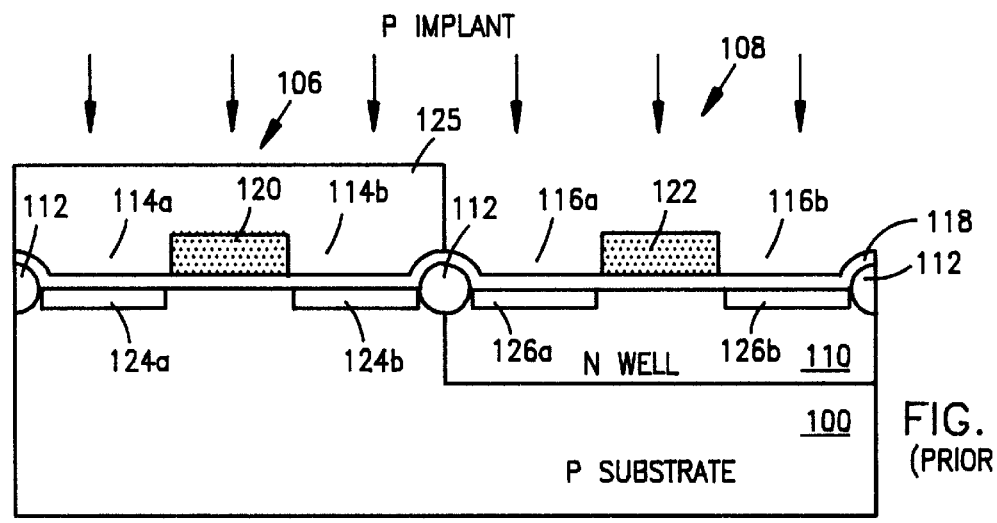

Similarly, in a second masking step and a second ion implant step, shown in FIG. 1C, a layer of photoresist material 125 is selectively formed over the substrate 100 which effectively masks gate structure 120, and N-channel lightly doped regions 124a and 124b. Then, a P⁻ implant is used to form P-channel transistor lightly doped regions 126a and 126b which are self-aligned with the gate 122. Portions of lightly doped regions 124a, 124b, 126a and 126b will become the LDD regions of a CMOS transistor formed on P-substrate 100.

Figure 1D:
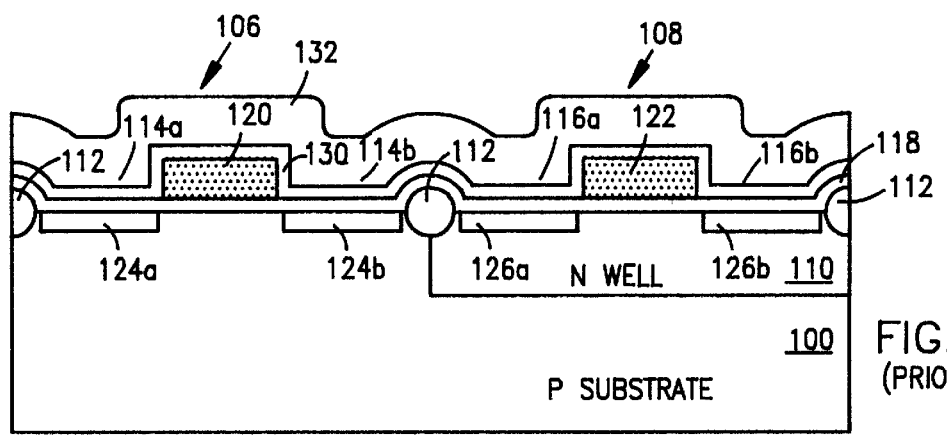

A thin etch stop layer 130 (approximately 200–500 Å) is formed over substrate 100, gates 120 and 122, and gate oxide 118 as shown in FIG. 1D. The etch stop layer 130 may be a silicon nitride ($Si_3N_4$) layer formed using conventional techniques. A spacer material layer 132, is then formed over nitride layer 130. The spacer material layer 132 may be formed of silicon dioxide ($SiO_2$). Etch stop layer 130 and spacer material layer 132 may be formed of other materials provided that the selected materials may be selectively etched with respect to each other.

Figure 1E:
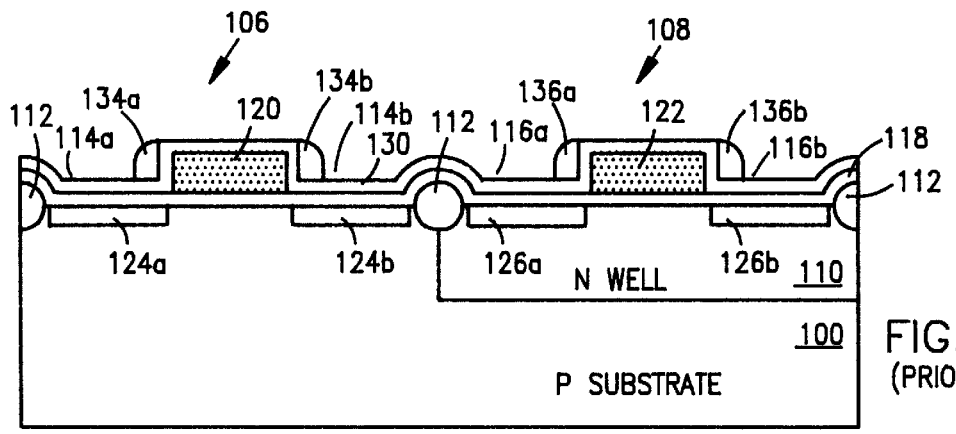

An etchant which selectively etches the spacer material layer 132, i.e., etches the spacer material layer 132 at a faster rate than etch stop layer 130, may be used to etch spacer material layer 132 until only spacers 134a and 134b, and 136a and 136b respectively remain at the ends of gates 120 and 122, as shown in FIG. 1E. Etch stop layer 130 is not penetrated by the etchant during the etching of spacer material layer 132, and thus active regions, 114a, 114b, 116a and 116b and field oxide regions 112 are protected and silicon loss in active regions and oxide loss in field oxide regions are prevented.

Figure 1F:
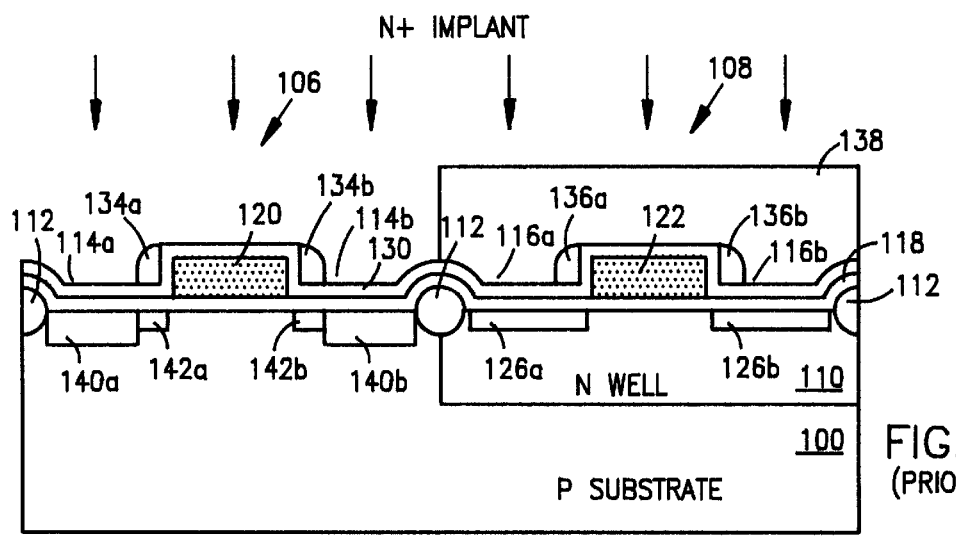

After the formation of spacers 134a, 134b, 136a and 136b, a third masking and third ion implant step is performed as shown in FIG. 1F. A layer of photoresist material 138 is selectively formed over the substrate 100 which effectively masks gate structure 122, and the P-channel lightly doped regions 126a and 126b. Then, an N⁺ implant is performed to form N⁺ source region 140b and N⁺ drain region 140a in portions of the lightly doped regions 124b and 124a respectively. Spacers 134a and 134b serve as masks to prevent ion implantation in the portions of lightly doped regions 124a and 124b underlying spacers 134a and 134b. These protected portions of the lightly doped regions 124a and 124b are the respective LDD region 142a and lightly doped source ("LDS") region 142b of the N-channel transistor 106.

Figure 1G:
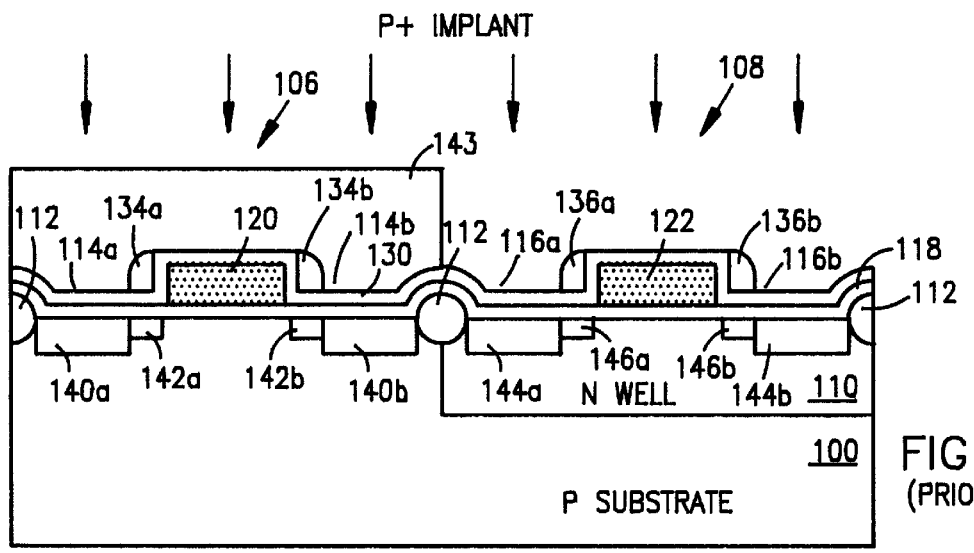

Similarly, in a fourth masking step and a fourth ion implant step, shown in FIG. 1G, a layer of photoresist material 143 is selectively formed over the substrate 100 which effectively masks gate structure 120, and the N-channel N⁺ source region 140b and N⁺ drain region 140a. Then, a P⁺ implant is performed to form P⁺ source region 144a and P⁺ drain region 144b in portions of the lightly doped regions 126a and 126b respectively. Spacer 136a and 136b serve as masks to prevent ion implantation in the portions of lightly doped regions 126a and 126b underlying spacers 136a and 136b. These protected portions of the lightly doped regions 126a and 126b are the respective LDS region 146a and LDD region 146b of the P-channel transistor 108.

Figure 1H:
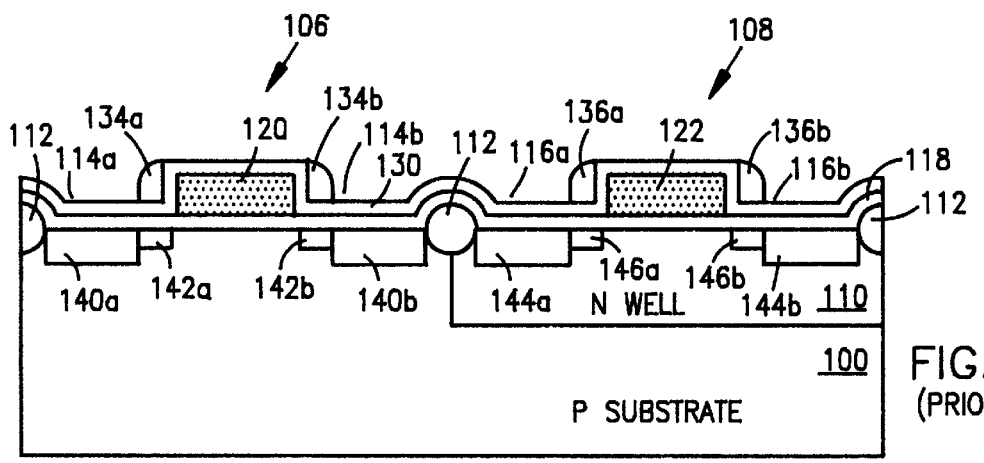
Figure 1I:
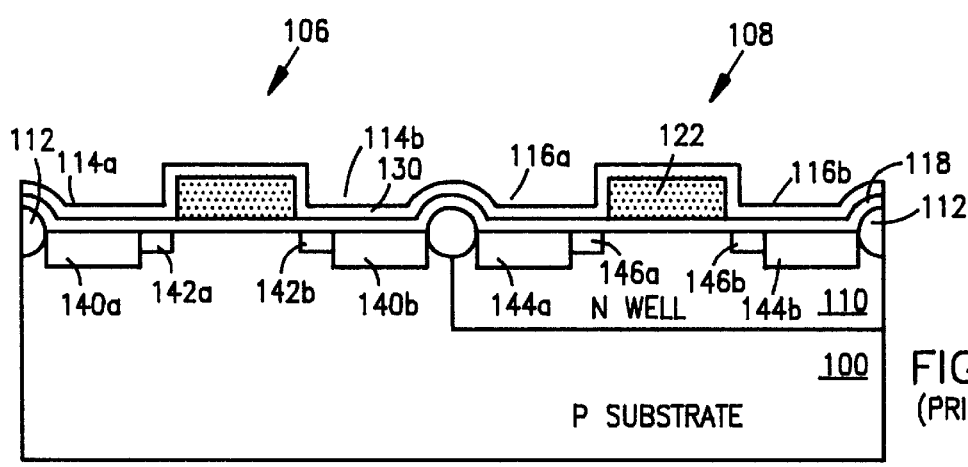

Referring to FIG. 1H, the photoresist layer 143 is stripped leaving the spacers 134a, 134b, 136a, and 136b. Nitride layer 130 can be removed by a wet etch. Etchants useful in removing nitride layer 130 include transene (16 $H_3PO_4$: 1 $HNO_3$: 1 Acetic acid: 2 $H_2O$). As nitride layer 130 is removed, the removal process also lifts off spacers 134a, 134b, 136a and 136b.

While the conventional method is able to reduce silicon loss in active regions and oxide loss in field oxide regions, it involves four masking steps to form the source, drain and LDD regions in a typical CMOS LDD fabrication process. The processing steps associated with each masking step adversely increase cycle time and process complexity and also introduce particles and defects, resulting in increases in cost and yield loss. The present invention provides a method for forming FET or CMOS transistors with LDD regions which minimizes silicon loss in active regions and oxide loss in field oxide regions, while at the same time reducing the number of masking steps required. A CMOS LDD fabrication process in accordance with the present invention involves only one masking step to form the source, drain and LDD regions.

FIGS. 2A through 2G illustrate a LDD process for fabricating CMOS transistors in accordance with the present invention in which only one mask is required. For convenience of illustration, like reference numerals are used in FIGS. 2A through 2G to denote like elements already described in FIGS. 1A through 1I.

Figure 2A:
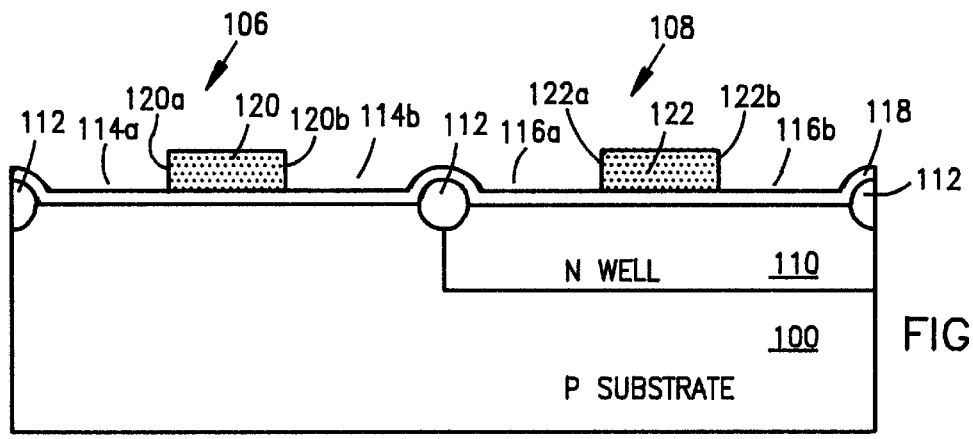
FIGS. 2A–G are schematic, cross-sectional illustrations showing the various stages of a LDD process in accordance with the present invention for fabricating CMOS transistors in which only one mask is used.

FIG. 2A is identical to FIG. 1A already illustrated earlier which shows a P substrate 100 with an N-well region 110, and an N-channel transistor 106 and a P-channel transistor 108 formed thereon. The transistors 106 and 108 shown here are prior to source, drain and LDD ion implantation. The dopant types discussed are used for the purpose of illustration. Further, the method of the present invention applies to the fabrication of both enhancement mode and depletion mode devices. Using conventional fabrication techniques, field oxide regions 112 are formed on substrate 100 to define active regions 114a, 114b, 116a and 116b. A gate oxide layer 118 is provided on the active regions 114a, 114b, 116a and 116b and also over the field oxide regions 112. Thereafter, gate structures 120 and 122 are formed on the active regions 114a, 114b, 116a and 116b. Gate structures 120 and 122, respectively, have side edges 120a, 120b and 122a, 122b. Active regions 114a, 114b and gate 120 will respectively form the drain, source and gate regions of the N-channel transistor 106. Similarly, active regions 116a, 116b and gate 122 will respectively form the source, drain and gate regions of the P-channel transistor 108.

Figure 2B:
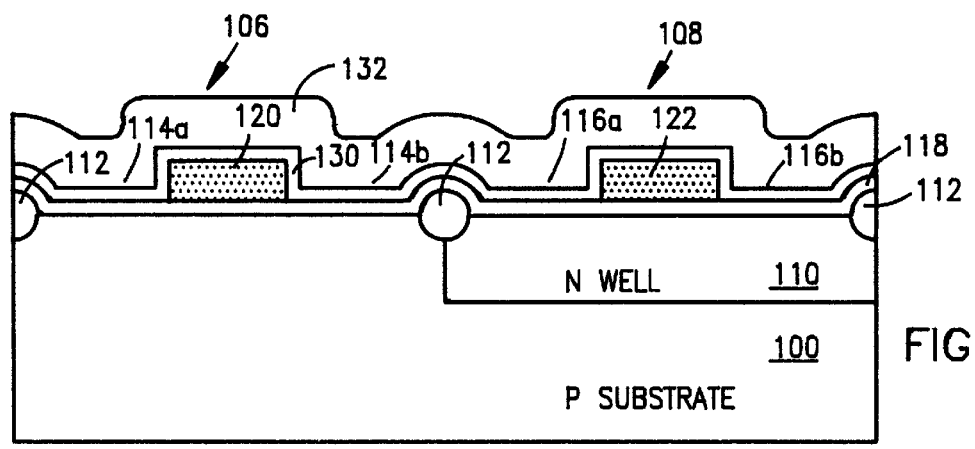

Next, a thin etch stop layer 130 (approximately 200–500 Å) is formed over substrate 100, gates 120 and 122, and gate oxide 118 as shown in FIG. 2B. The etch stop layer 130 may be a silicon nitride ($Si_3N_4$) layer formed using conventional techniques. A spacer material layer 132, is then formed over nitride layer 130. The spacer material layer 132 may be formed of silicon dioxide ($SiO_2$). Etch stop layer 130 and spacer material layer 132 may be formed of other materials provided that the selected materials may be selectively etched with respect to each other.

Figure 2C:
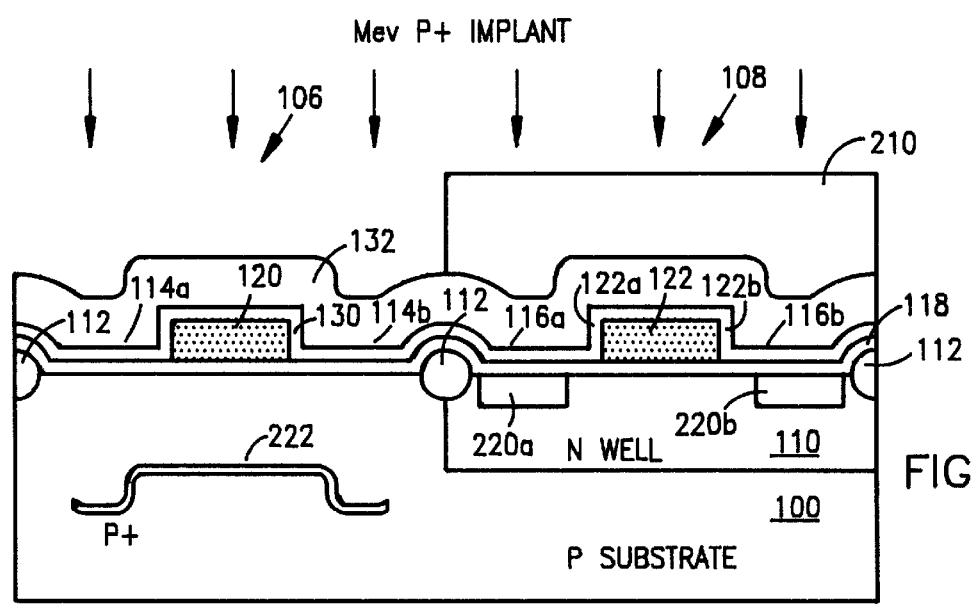

In a first masking step, shown in FIG. 2C, a layer of photoresist material 210 with a selected thickness is selectively formed over the P substrate 100 which effectively covers gate structure 122 and active regions 116a and 116b. In this embodiment, an MeV P$^+$ implant is used to form P$^+$ source region 220b and P$^+$ drain region 220a of P-channel transistor 108 through the photoresist material 210 and the spacer oxide layer 132. The MeV P$^+$ implant is performed with, for example, B$^+$ ions Boron ions at an energy level of greater than 1 million electron volts. The energy for the MeV implant, the thickness of the photoresist material 210, and the thickness of the spacer oxide layer are optimized such that (1) P$^+$ source region 220b and P$^+$ drain region 220a of P-channel transistor 108 are formed right beneath their respective active regions 116b and 116a; (2) the extra thickness of the spacer oxide material 132 around the side edges 122a and 122b of gate 122 serve as a mask to prevent ion implantation in those portions of active regions 116a and 116b; and (3) a P$^+$ implant image 222 is formed at a distance far beneath the active region 114a and 114b such that it will not adversely affect the performance of the N-channel transistor 106. The above three requirements may be met by using an implant with B$^+$ ions at 600 KeV to 1.0 MeV with an implant dosage of, for example, $3\times10^{15}$ atoms per cm$^2$, a photoresist material 210 with a selected thickness in the range of approximately 0.5 to 3.0 microns ($\mu$m) and a preferred thickness of approximately 1.0 $\mu$m, and spacer oxide material layer 132 thickness of approximately 1000 Å. The resulting P$^+$ implant image 222 is formed at a distance of approximately 0.3 to 3.0 $\mu$m beneath the active region 114a and 114b which is sufficiently spaced to avoid adversely affecting the performance of the N-channel transistor 106.

Figure 2D:
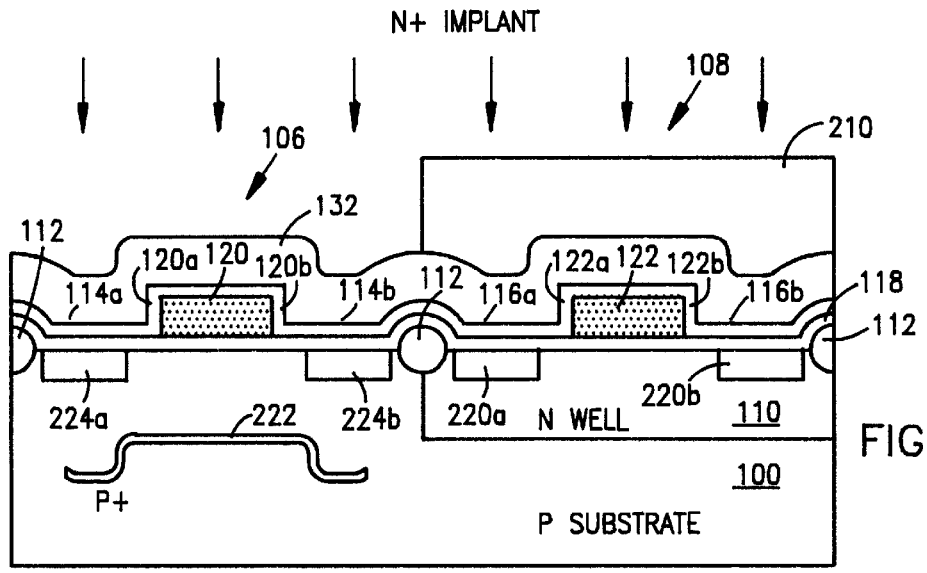

Next, an N$^+$ implant is applied as shown in FIG. 2D. The energy used for the ion implant is adjusted so that the photoresist material 210 will serve as a mask to prevent ion implantation in the active areas 116a and 116b. P$^+$ source region 224b and P$^+$ drain region 224a of P-channel transistor 106 are formed right beneath their respective active regions 114b and 114a. Similarly, the extra thickness of the spacer oxide material 132 around the side edges 120a and 120b of gate 120 serve as a mask to prevent ion implantation in those portions of active regions 114a and 114b. It is found that for an implant with As$^+$ ions with an implant dosage of, for example, $5\times10^{15}$ atoms per cm$^2$, the energy used with different spacer oxide layer 132 thickness are as follows:

| Spacer oxide thickness (Å) | As$^+$ ion energy (KeV) |
|---|---|
| 1000 | 200 |
| 1500 | 300 |
| 2000 | 400 |

Figure 2E:
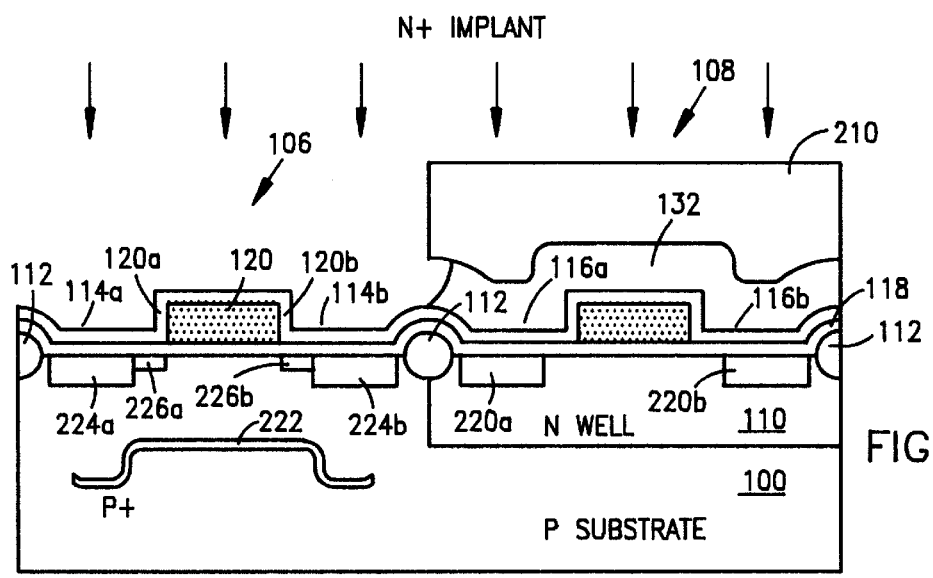

Thereafter, the spacer oxide layer 132 over gate 120 and active regions 114a and 114b is selectively removed by using buffered Hydrogen Fluoride (H$_2$O:HF=10:1) as shown in FIG. 2E, while leaving the photoresist layer 210 intact. Etch stop layer 130 is not penetrated by the Hydrogen Fluoride during the removal of spacer oxide layer 132, and thus active regions 114a, 114b, 116a and 116b and field oxide regions 112 are protected and silicon loss in active regions and oxide loss in field oxide regions are prevented.

Thereafter, a third ion implant step is performed in which an N$^-$ implant is used to form N-channel transistor LDD region 226a and LDS region 226b which are respectively self-aligned with the side edges 120a and 120b of gate 120. An N-type dopant for use in implanting LDD region 226a and LDS region 226b may be, for example, phosphorus ions at 30 KeV with an implant dosage of, for example, $6\times10^{13}$ atoms per cm$^2$.

Figure 2F:
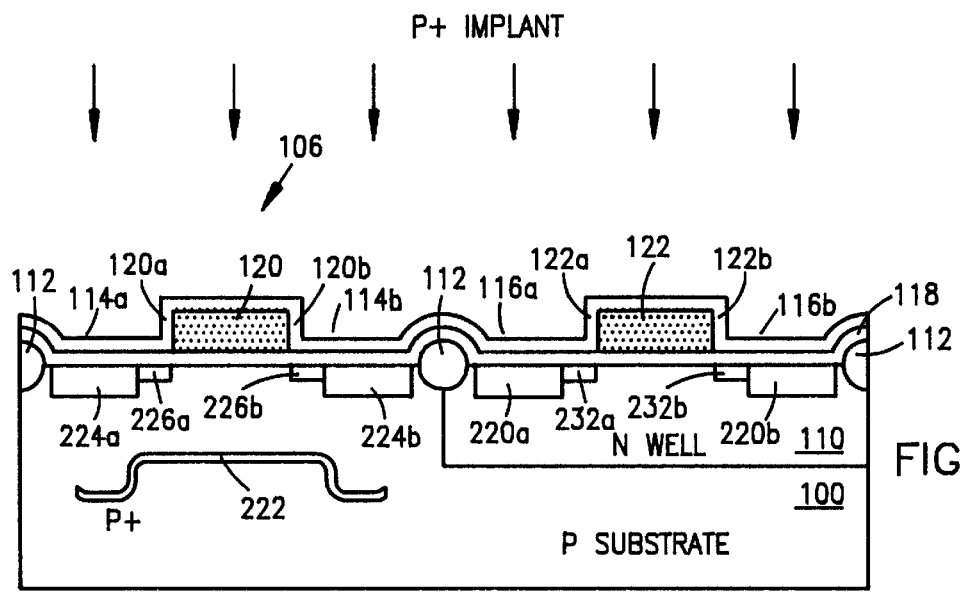

Then, the photoresist layer 210 is stripped off using conventional techniques. The spacer oxide layer 132 underneath the photoresist 210 is again selectively removed by using buffered hydrogen fluoride. Thereafter, a fourth ion implant step is performed as shown in FIG. 2F in which P$^-$ implant is used to form P-channel transistor LDD region 232a and LDS region 232b which are respectively self-aligned with the side edges 122a and 122b of gate 122. A P-type dopant for use in implanting lightly doped regions 232a and 232b may be, for example, BF$_2^+$ ions at 30 KeV with an implant dosage of, for example, $3\times10^{13}$ atoms per cm$^2$.

Figure 2G:
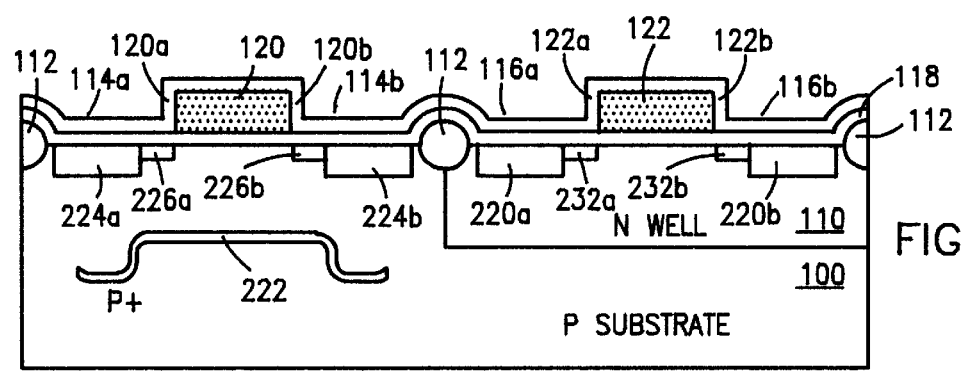

Referring to FIG. 2G, after the fourth ion implantation step, a CMOS transistor structure is shown that is similar to what was shown in FIG. 11. The etch stop layer 130 may be removed with hot phosphoric acid. Thus, by using the present invention, only one masking step, instead of four, is required to implement a CMOS LDD fabrication process which would minimize silicon loss in active regions and oxide loss in field oxide regions.

Accordingly, by using the method of the present invention for forming FET transistors with LDD regions, one can minimizes silicon loss in active regions and oxide loss in field oxide regions, while at the same time reducing the number of masking steps required. A CMOS LDD fabrication process in accordance with the present invention involves only one masking step to form the source, drain and LDD regions. By eliminating three masking steps, the present invention provides a CMOS LDD processing method that reduces cycle time and process complexity and also minimize particles and defects, resulting in a reduction in cost and yield loss.

The above described embodiments are merely illustrative of the present invention. Various alternate designs will become apparent to those skilled in the art after reading the above disclosure. It is to be understood that the scope of the invention is not limited merely to the above described embodiments.

What is claimed is:

1. A method of fabricating a transistor having lightly doped drain regions, comprising the sequential steps of:

(a) providing a substrate having an active region with a first conductivity type defined by field oxide regions;

(b) providing a gate, having side edges, overlying a portion of said active region;

(c) forming an etch stop layer on said gate and said active region;

(d) forming an oxide layer on said etch stop layer and over said active region, including said gate;

(e) forming a disposable material layer with a thickness over on said oxide layer and over said said active region, including said gate;

(f) providing a first dopant of a second conductivity type to form heavily doped source and drain regions of said second conductivity type about the side edges of said gate through said disposable material layer, said oxide layer and said etch stop layer into said substrate, wherein said first dopant is implanted at an energy level of approximately 1 million electron volts;

(g) removing said disposable material layer;

(h) removing said oxide layer on said etch stop layer and over said active region, including said gate; and (i) providing a second dopant of said second conductivity type to form lightly doped drain regions of said second conductivity type about the side edges of said gate adjacent to said heavily doped drain and source regions through said etch stop into said substrate.

2. The method of claim 1 wherein said step of providing said first dopant comprises implanting said first dopant.

3. The method of claim 1 wherein said step of providing said second dopant comprises implanting said second dopant.

4. The method of claim 3 wherein said step of implanting said second dopant uses an energy level of greater than 20 KeV.

5. The method of claim 1 wherein said step of forming an etch stop layer comprises forming a layer of silicon nitride.

6. The method of claim 5 wherein said step of removing said oxide layer over said active region comprises etching said oxide layer.

7. The method of claim 6 wherein said first conductivity type is N conductivity type and said second conductivity type is P conductivity type.

8. The method of claim 6 wherein said first conductivity type is P conductivity type and said second conductivity type is N conductivity type.

9. The method of claim 1 wherein said disposable material layer is a photoresist material.

10. The method of claim 1 wherein said selected thickness is approximately in the range of 0.5 to 3.0 $\mu$m.

* * * * *